| | | | |
|---|---|---|---|
| United States Patent [19] | | [11] | 3,962,108 |
| Perruccio | | [45] | June 8, 1976 |

[54] CHEMICAL STRIPPING SOLUTION

[75] Inventor: Salvatore M. Perruccio, San Jose, Calif.

[73] Assignee: KTI Chemical, Inc., Sunnyvale, Calif.

[22] Filed: Nov. 3, 1975

[21] Appl. No.: 628,204

[52] U.S. Cl. .................................. 252/142; 134/3; 134/38; 134/41
[51] Int. Cl.² ...................... C11D 7/08; C23G 1/02
[58] Field of Search ............ 134/3, 41, 38; 252/142

[56] References Cited
UNITED STATES PATENTS

| | | | |
|---|---|---|---|
| 3,676,219 | 7/1972 | Schroeder et al. | 134/3 |
| 3,728,154 | 4/1973 | Suzuki | 134/3 |
| 3,787,239 | 1/1974 | Schroeder et al. | 252/142 X |
| 3,900,337 | 8/1975 | Beck et al. | 134/3 |

*Primary Examiner*—Harris A. Pitlick
*Attorney, Agent, or Firm*—Boone, Schatzel & Hamrick

[57] ABSTRACT

A stripping solution comprising between 80 and 98% $H_2SO_4$, between 0.5 and 4% $HClO_4$, between 0.5 and 4% $CrO_3$ and $H_2O$. The principal application of the solution is to remove polymerized photoresist layers formed during the manufacture of semiconductor devices.

4 Claims, No Drawings

CHEMICAL STRIPPING SOLUTION

BACKGROUND OF THE INVENTION

1. Field of the Invention

The present invention relates generally to photochemical processing materials and more particularly to a chemical solution of the type commonly referred to as a stripping solution for removing polymeric photoresist materials from semiconductor surfaces and the like.

2. Description of the Prior Art

It has long been the practice in the semiconductor industry to use photoresist techniques as the means for developing circuit geometries on a silicon body or silicon dioxide layer during the several stages of integrated circuit manufacture. More particularly, for each circuit pattern to be developed, the substrate is coated with a polymeric photoresist and the photoresist is exposed through a pattern mask to ultraviolet or other suitable light energy which causes certain areas of the photoresist layer to become polymerized. The unpolymerized portions of the layer are then dissolved and removed by a developer solvent, and the residual photoresist film is dried and baked to leave a pattern of polymeric resist which can be used to accomplish a desired etching or dopant deposition operation.

However, following use of the photoresist pattern, it is necessary that the pattern be removed from the surface of the semiconductor. This is normally accomplished by means of a stripper solution. Although numerous prior art formulations have been found more or less suitable for photoresist removal, most such solutions must be used at elevated temperatures of from 90° and 100° C, or are corrosive to the metallic aluminum films that are frequently associated with silicon dioxide coated slicon bodies used in the manufacture of semiconductors.

One prior art stripper solution is disclosed in U.S. Pat. No. 3,676,219 to Allied Chemical Coporation.

SUMMARY OF THE PRESENT INVENTION

It is therefore a primary objective of the present invention to provide a new stripping solution which may be used at room temperatures and does not cause etching, peeling, or other visible degradation of silicon bodies or silicon dioxide films.

Another object of the present invention is to provide a new stripping solution which may be used at room temperature and does not cause etching, peeling, or other visible degradation of aluminum or silicon aluminum films deposited on a substrate.

Briefly, the present invention is a stripping solution comprised of sulfuric acid, perchloric acid, chromium trioxide and water mixed together in concentrations described below in detail.

The principal advantage of the present invention is that it provides a highly efficient stripping solution which may be used at room temperature or above to remove polymerized materials and which causes no measurable degradation of underlying silicon or aluminum materials during the stripping operation.

DETAILED DESCRIPTION OF THE PREFERRED EMBODIMENT

The solution of this invention is comprised of a mixture of sulfuric acid ($H_2SO_4$), perchloric acid ($HClO_4$), chromium trioxide ($CrO_3$) and water, and may be made using a wide range of constituent concentrations.

Although no particular procedure is required for the manufacture of solutions in accordance with the present invention, generally speaking, the solution is made by mixing the four constituents at room temperature in the following proportionate ranges: $H_2SO_4$ (between 80 and 98%), $HClO_4$ (between 0.5 and 4%), $CrO_3$ (between 0.5 and 4%), and $H_2O$ in deionized form (between 0 and 8%).

The preferred mixing procedure is to mix together appropriate quantities of deionized $H_2O$ and $CrO_3$, in flake form, stirring the mixture until all flakes are dissolved. The resulting chromic acid mixture is then added slowly and cautiously (with agitation) to an appropriate quantity of $H_2SO_4$. As the chromic acid is added to the $H_2SO_4$, a solid $CrO_3$ precipitate will initially appear on the surface and cling to the sides of the mixing vessel. Accordingly, blending of the mixture must continue until all of the precipitate is dissolved. The $HClO_4$ is then added and the solution is further blended for 2–3 minutes. At this point the mixture is complete and is ready for packaging. The solution is stable and may be packaged, shipped and handled using the care and safety precautions ordinarily accorded corrosive chemicals.

Although the above-described procedure for mixing the various constituents is preferred, the solution can also be made by first placing the $H_2O$ and $CrO_3$ in a container and then blending the $HClO_4$ with the $H_2O$ and $CrO_3$ until all of the ingredients are in solution. The $H_2SO_4$ is then added to the mixture with agitation. Although this procedure might be considered safer than the previous mixing procedure, it takes approximately twice as long to place all constituents in solution, i.e., 25 minutes as compared to less than 15 minutes for the preferred procedure.

A third alternative method of manufacturing the solution is to mix the $H_2O$, $H_2SO_4$, and $HClO_4$ in a cooling vessel cooled to between 0° and 5°C. The $CrO_3$ is then mixed with the solution and agitated until all precipitate is dissolved. This method however, is substantially slower than the above described procedures and takes approximately 45 minutes to get all of the constituents into solution.

In order to demonstrate the effectiveness of various solutions of the present invention for use in the manufacture of semiconductors, several test wafers were prepared and three examples of solutions having constituent concentrations spanning the above stated ranges were mixed.

More specifically, using KTI's Formula R 60CS, 2-inch and 3-inch diameter silicon, silicon-dioxide coated silicon and aluminum coated silicon wafers were processed. The wafers were spun at 5,000 rpm in order to obtain a uniformly distributed film of photoresist, were soft baked at 83°C. for twenty minutes, exposed to ultraviolet radiation for 5 seconds, developed by immersing in Xylene solvent, and then hard baked at 160°C. for 30 minutes. The wafers were then immersed in test solutions mixed as per the following examples:

EXAMPLE 1

A quantity of 478 grams of 98% $H_2SO_4$ was weighed out and poured into a blending vessel. 9.5 grams of deionized $H_2O$ was poured into a separate container, and 10 grams of anhydrous flake $CrO_3$ was added to the water and stirred until dissolved. This solution was then mixed with the $H_2SO_4$ and agitated until all of the precipitate was dissolved. 2.5 grams of $HClO_4$ was then weighed and added to the mixture while the mixture was being stirred. The resulting mixture fumes and heat is generated, therefor it is important that stirring of the mixture continue unitl all constituents are equally apportioned in the mixture.

To test this solution, several of each type of the above described coated wafers were immersed in the solution and the solution was slightly agitated. The polymeric layer was removed in 10 minutes while the solution was at a temperature of 30°C. The wafers were then withdrawn from the solution, washed in DI water and inspected. All of the wafers had been completely stripped of photoresist. The aluminum coated wafers were then returned to the solution and left for 17 hours at 25°–30°C. They were then removed and again washed in the DI water. An inspection revealed no visible attack of the aluminum.

EXAMPLE 2

A quantity of 3 grams of $CrO_3$ was deposited in 5 grams of deionized $H_2O$ and the mixture was stirred until all of the $CrO_3$ was dissolved. The resulting chromic acid was then combined with 478 grams of 98% $H_2SO_4$ while stirring the mixture. 14 grams of $HClO_4$ was then weighed and added to the mixture with stirring as in Example 1. Coated wafers were then immersed in the solution. The photoresist was completely stripped from the wafers in 22 minutes.

EXAMPLE 3

400 grams of 98% $H_2SO_4$, 70 grams of 70% $HClO_4$, 10 grams of DI $H_2O$, and 20 grams of anhydrous $CrO_3$ flake were mixed as in the above examples. Coated wafers were then immersed in the solution and it was observed that a period of 43 minutes was required in order to obtain complete stripping of the photoresist from the wafers.

No etching, peeling or other visible degradation of the silicon bodies, silicon dioxide film on silicon bodies, aluminum or silicon aluminum films deposited on a silicon substrate was observed. Moreover, the solution had no apparent effect on the electrical resistivity of the silicon bodies.

In addition to semiconductor processing applications the solutions of the invention may also be effective for the removal of other polymeric or like organic deposits from inorganic surfaces such as silica, glass and the like, and from organic surfaces such as polyethelene, polytetra flouroethylene and acrylonitrile-butadiene-styrene terpolymers. The stripping capacity of the solutions of the present invention improve with increased chromium trioxide concentration and the preferred solutions are those containing relatively high proportions of chromium trioxide. The stripper can also be used on aluminum coated substrates to a much greater extent than the prior art stripping agents due to the presence of perchloric acid and the low water content.

In the present invention chromium trioxide is supplied to the solution in crystalline state as the anhydride of chromic acid. However, the $CrO_3$ may also be supplied in the form of salts such as the chromate salts and the dichromate salts. Compositions in accordance with the present invention may also contain minor quantities of other ingredients so long as they do not interfere with the intended use.

All numerically expressed portions herein set forth are by weight based on total solution unless otherwise indicated.

It is to be understood that the specific details recited in this specification are set forth by way of illustration only and not by way of limitation of the invention. For example, as will be obvious to anyone of ordinary skill in the art, various additives may be added to the stripping solutions of the invention without altering the basic properties and characteristics of the solutions. Illustrative are thickeners such as colloidal silica. Hence the scope of the invention is to be limited only by a reasonable interpretation of the following claims.

What is claimed is:

1. A stripping solution for removing organic deposits from wafers of silicon, silicon dioxide coated silica, aluminum coated silicon and the like, comprising at least 80% $H_2SO_4$, at least 0.5% $HCLO_4$, at least 0.5% $CrO_3$, and $H_2O$.

2. A stripping solution for removing organic deposits from wafers of silicon, silicon dioxide coated silica, aluminum coated silicon and the like, comprising:

$H_2SO_4$ in an amount between 80 and 98 percent by weight of the total solution;

$H_2O$ in an amount between 0 and 8 percent by weight of the total solution;

$HClO_4$ in an amount between 0.5 percent and 4 percent by weight of the total solution; and $CrO_3$ in an amount between 0.5 and 4 percent by weight of the total solution.

3. A method of making a stripping solution for removing organic deposits from silicon, silicon dioxide coated silica, and aluminum coated silicon surfaces comprising mixing $H_2SO_4$, $HClO_4$, $H_2O$, and $CrO_3$ in the respective proportions of at least 80 percent, at least 0.5 percent, at least 0.01 percent, and at least 0.5 percent, and stirring the mixture until all of the constituents are in solution.

4. A method of making a stripping solution for removing organic deposits from silicon, silicon dioxide coated silica, and aluminum coated silicon surfaces comprising:

dissolving $CrO_3$ flake in DI $H_2O$ to provide a chromic acid solution;

pouring the chromic acid solution into a quantity of $H_2SO_4$ and stirring until all precipitate is in solution; and adding a predetermined quantity of $HClO_4$ to the mixture and blending for at least one minute, the $H_2SO_4$ constituting at least 80 percent of the solution, the $CrO_3$ constitutng at least 0.5 percent of the solution, and the $HClO_4$ constituting at least 0.5 percent of the solution.

* * * * *